(12) United States Patent
Kaashoek

(10) Patent No.: US 7,626,408 B1
(45) Date of Patent: Dec. 1, 2009

(54) ELECTRICAL SPRING PROBE

(75) Inventor: Kurt F. Kaashoek, Scottsdale, AZ (US)

(73) Assignee: KK Technologies, Inc., Scottsdale, AZ (US)

( * ) Notice: Subject to any disclaimer, the term of this patent is extended or adjusted under 35 U.S.C. 154(b) by 121 days.

(21) Appl. No.: 11/347,502

(22) Filed: Feb. 3, 2006

Related U.S. Application Data

(60) Provisional application No. 60/650,236, filed on Feb. 3, 2005.

(51) Int. Cl.
*G01R 1/067* (2006.01)
(52) U.S. Cl. ...................... 324/761; 324/754
(58) Field of Classification Search .......... 324/754–765
See application file for complete search history.

(56) References Cited

U.S. PATENT DOCUMENTS

| | | | | |
|---|---|---|---|---|
| 4,438,397 A * | 3/1984 | Katz | ............................ | 324/761 |
| 4,560,926 A * | 12/1985 | Cornu et al. | .................. | 324/761 |
| 5,557,213 A | 9/1996 | Reuter et al. | | |
| 5,791,914 A | 8/1998 | Loranger et al. | | |
| 6,190,181 B1 * | 2/2001 | Affolter et al. | ................. | 439/70 |
| 6,249,440 B1 | 6/2001 | Affolter | | |
| 6,323,667 B1 * | 11/2001 | Kazama | ....................... | 324/761 |
| 6,337,572 B1 * | 1/2002 | Kazama | ....................... | 324/754 |
| 6,341,962 B1 * | 1/2002 | Sinclair | ......................... | 439/66 |
| 6,462,567 B1 | 10/2002 | Vinther et al. | | |
| 6,642,728 B1 * | 11/2003 | Kudo et al. | ................... | 324/754 |
| 6,655,983 B1 * | 12/2003 | Ishikawa et al. | ............. | 439/482 |
| 6,844,749 B2 * | 1/2005 | Sinclair | ........................ | 324/761 |
| 7,057,403 B2 * | 6/2006 | Kazama | ....................... | 324/754 |
| 7,154,286 B1 * | 12/2006 | Marx et al. | ................... | 324/761 |
| 7,427,869 B2 * | 9/2008 | Cram et al. | .................. | 324/754 |

* cited by examiner

*Primary Examiner*—Ernest F Karlsen
(74) *Attorney, Agent, or Firm*—Richard E. Oney; Tiffany & Bosco, P.A.

(57) ABSTRACT

An electrical spring probe has an elongated contact and a helical spring. The spring probe is mounted in a through hole of a non-conductive substrate. The elongated contact includes a head with a V-slot groove for engaging a solder ball lead of an IC package, a shoulder providing a surface to retain a helical spring and a beam for providing a short contact path through the spring. The helical spring is disposed about the contact, with contiguous coils on each end. The upper end of the spring is secured to the contact shoulder immediately under the head. The middle coils of the spring have a larger diameter than the contiguous coils on either end to retain the spring probe assembly in the non-conductive substrate. The bottom end of the helical spring has contiguous coils some of which extend below the substrate surface to make electrical contact with a printed circuit board. The bottom contiguous coils are of a reduced diameter and have a center axis offset from the main axis of the spring probe assembly. When the spring probe is compressed between the IC package and the printed circuit board, the offset coils deflect the beam of the contact into the bottom contiguous coils establishing a direct electrical path between the IC package and the printed circuit board with minimum electrical impedance.

26 Claims, 6 Drawing Sheets

FIG. 3

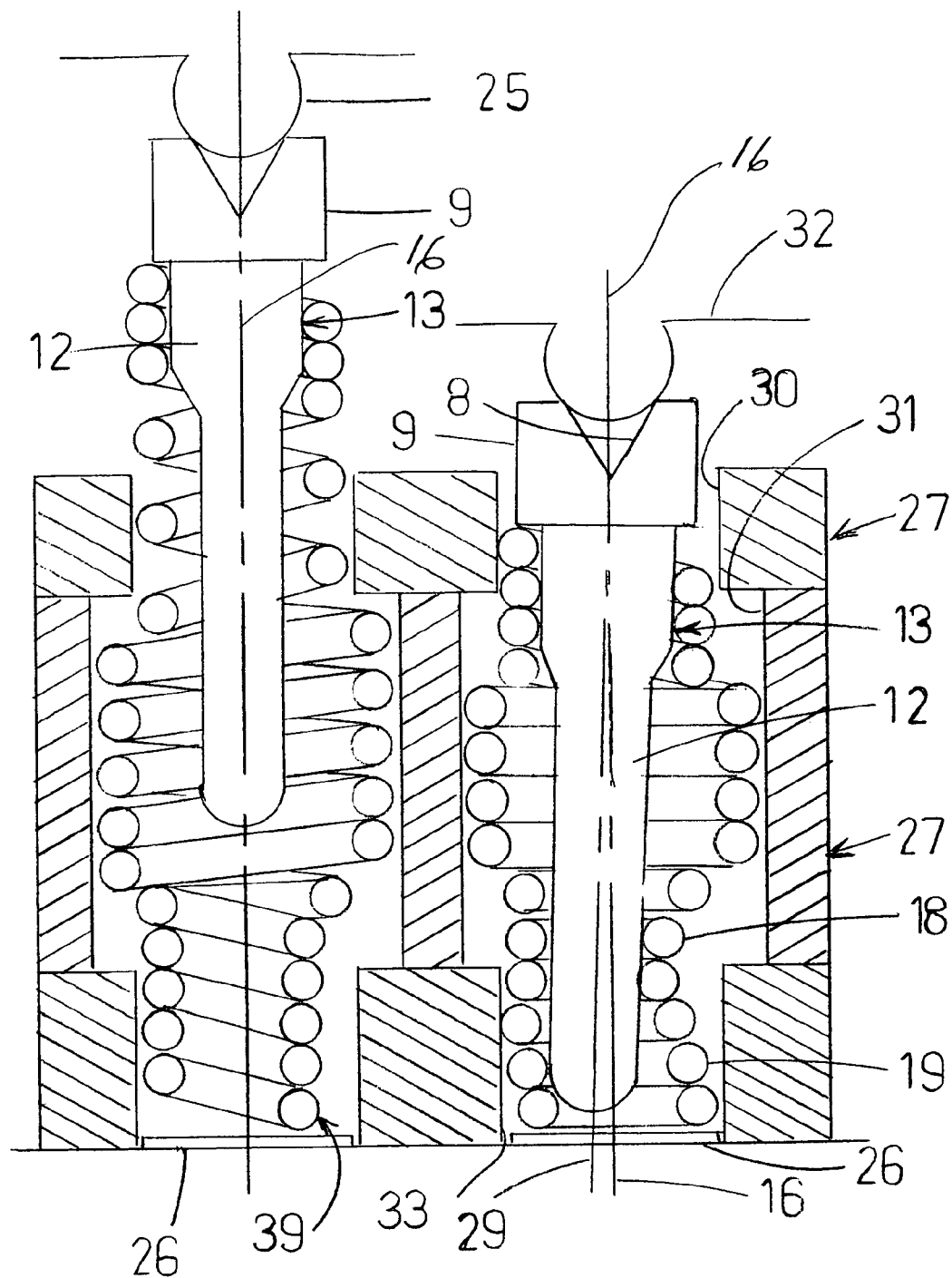

FIG 5a
FIG 5b
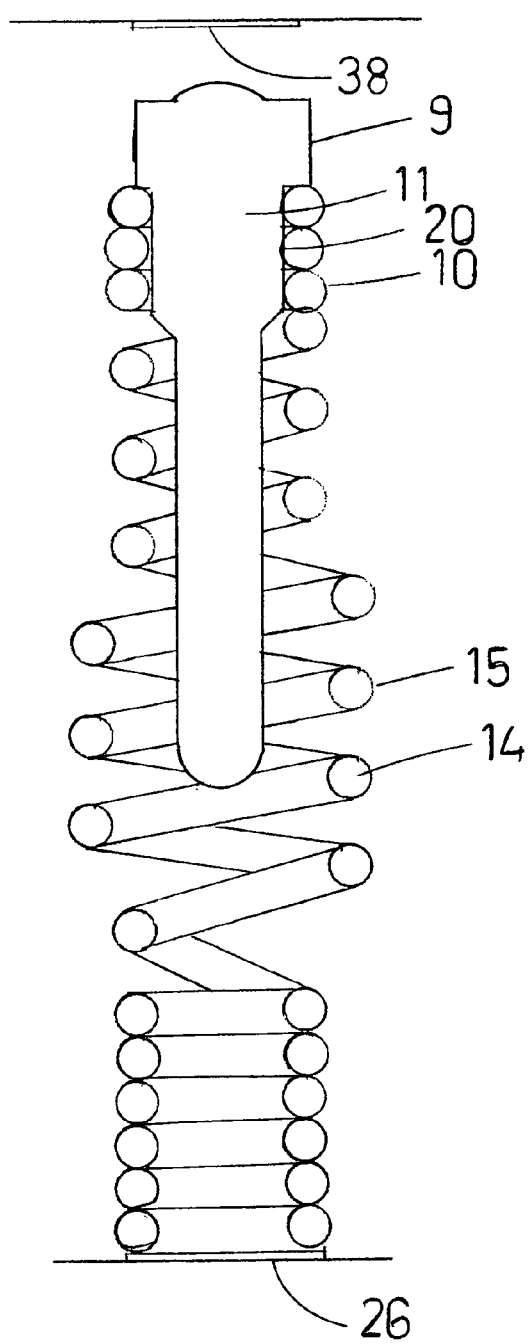
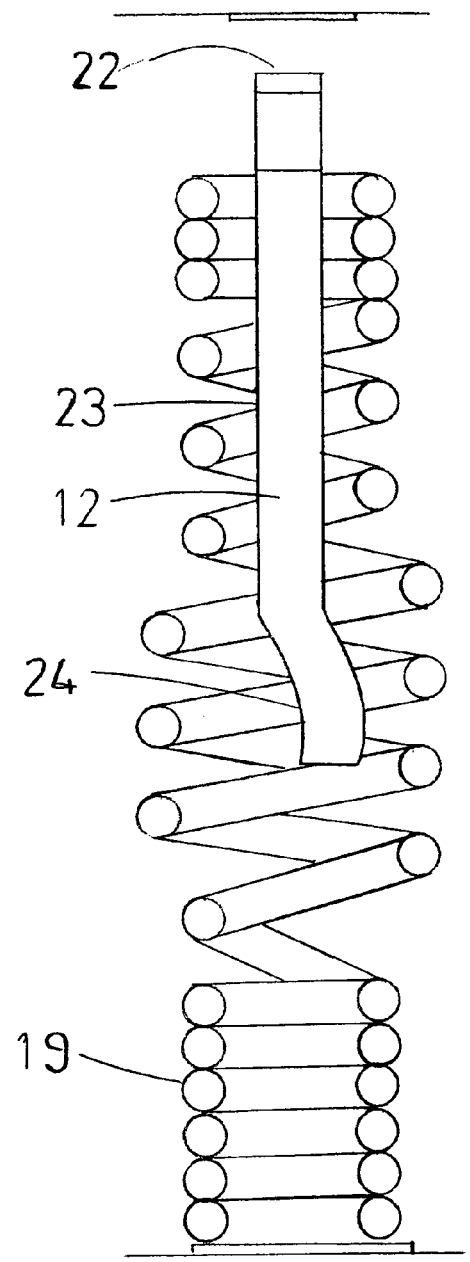

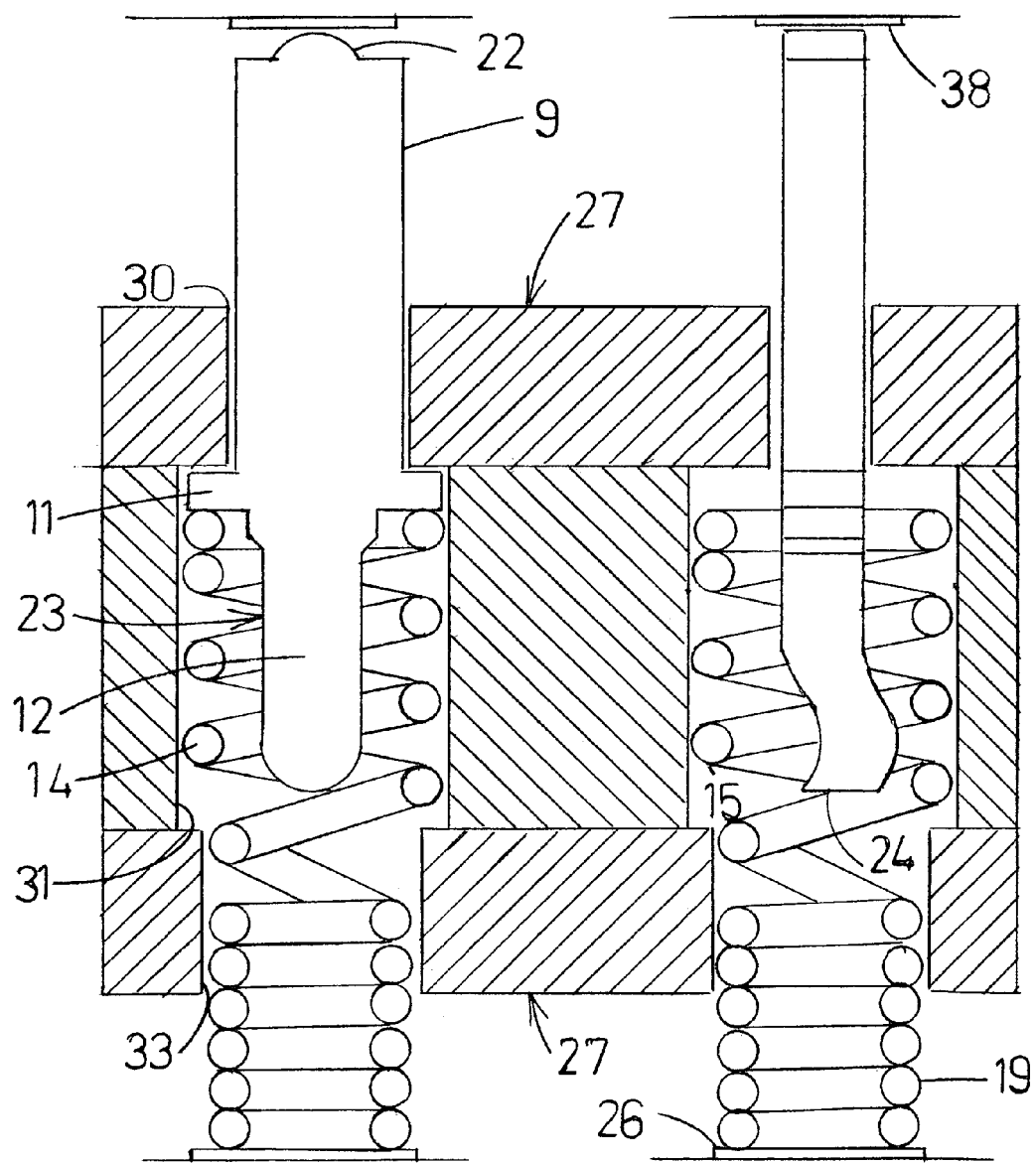

ELECTRICAL SPRING PROBE

RELATED APPLICATION DATA

This application is based on and claims the benefit of U.S. Provisional Patent Application No. 60/650,236 filed on Feb. 3, 2005, the disclosure of which is incorporated herein in its entirety by this reference.

BACKGROUND

The subject invention relates to spring probes for electrically accessing various parts of printed circuit boards, semiconductor devices and other electric and electronic components. More particularly, the invention relates to an improved spring probe having an elongated electrically conductive contact and an elongated helical coil disposed about the beam and attached to the contact. The spring includes an offset spring lower end configured so that, when the spring probe is compressed, the elongated contact firmly contacts the spring lower end and establishes a direct electrical path between the contact head and the spring lower end.

FIG. 1 shows a conventional spring-loaded contact probe. As shown in FIG. 1, such probes generally include a movable plunger 2, a barrel 3 having an open end 4 for containing an enlarged diameter section or bearing 6 of the plunger, and a spring 5 for biasing the travel of the plunger in the barrel. The plunger bearing 6 slidably engages the inner surface of the barrel. The enlarged bearing section is retained in the barrel by a crimp 7 near the barrel open end.

The plunger is commonly biased outwardly a selected distance by the spring and may be biased or depressed inwardly into the barrel, a selected distance, under force directed against the spring. Axial and side biasing of the plunger against the barrel prevents false opens or intermittent points of no contact between the plunger and the barrel. The plunger generally is solid and includes a head or tip for contacting electrical devices under test. The barrel may also include a tip opposite the barrel's open end.

The barrel, plunger and tip(s) form an electrical interconnect between the electrical device under test and test equipment and as such, are manufactured from an electrically conductive material. Typically the probes are fitted in cavities formed through the thickness of a test plate or socket. The test plate or socket assembly process includes placing the test probes into either precision custom-machined plastic subassemblies or injection molded subassemblies formed from costly precision injection mold tools. Generally, a contact side of the electrical device to be tested, such as an integrated circuit, is brought into pressure contact with the tips of the plungers protruding through one side of the test plate or test socket for maintaining spring pressure against the electrical device. A contact plate connected to the test equipment is brought into contact with the tips of the plungers protruding through the other side of the test plate or test socket. The test equipment transmits test signals to the contact plate from where they are transmitted through the test probe interconnects to the device being tested. After the electrical device has been tested, the pressure exerted by the spring probes is released and the device is removed from contact with the tip of each probe. In conventional systems, the pressure is released by moving the electrical device and probes away from one another, thereby allowing the plungers to be displaced outwardly away from the barrel under the force of the spring, until the enlarged-diameter bearing of the plunger engages the crimp 7 on the barrel.

The process of making a conventional spring probe involves separately producing the compression spring, the barrel and the plunger. The compression spring is wound and heat treated to produce a spring of a precise size and of a controlled spring force. The plunger is typically turned on a lathe and heat-treated. The barrels are typically deep drawn and heat-treated. All components may be subjected to a plating process to enhance conductivity. The spring probe components are assembled either manually or by an automated process.

To assemble an internal spring configuration spring probe, such as that shown in FIG. 1, the compression spring is first placed in the barrel, the plunger bearing 6 is then inserted into the barrel to compress the spring, and the barrel is roll crimped near its open end forming a crimp 7 to retain the plunger. Some internal spring configuration probes consist of two plungers each having a bearing fitted in an opposite open end of a barrel. The two plungers are biased by a spring fitted in the barrel between the bearings of each plunger.

As can be seen, the assembly of the probes and sockets is a multiple step process. The fabrication of the sub-assemblies requires costly custom machining or complex tooling. Considering that probes and sockets are produced by the thousands, a reduction in the equipment, materials and steps required to produce them can result in substantial savings.

An important aspect of testing integrated circuit boards is that they are tested under high frequencies. As such, impedance matching is required between the test equipment and integrated circuit so as to avoid attenuation of the high frequency signals. As discussed earlier, the probes are placed in cavities in a test socket. Due to the numerous probes that are used in a relatively small area in the socket, the spacing between probes is minimal, making impedance matching infeasible. In such situations, in order to avoid attenuation of the high frequency signals, the length of the electrical interconnects formed by the probes must be kept to a minimum. With current probes, when the interconnect length is minimized so is the spring length and thus, spring volume.

A spring's operating life, as well as the force applied by a spring is proportional to the wire length, the diameter of the wire forming the spring, and the diameter of the spring itself (i.e.: spring volume). These requirements for a given spring operating life and required spring force are in contrast with the short spring length requirements for avoiding the attenuation of the high frequency signals. For example, in internal spring configuration probes, the compressed or solid length of the spring is limited by the barrel length minus the length of the plunger enlarged bearing section, minus the length of the barrel between the crimp and the barrel open end and minus the distance of plunger travel. Since the diameter of the spring is limited by the diameter of the barrel which is limited by the diameter of the cavities in the test sockets, the only way to increase the spring volume for increasing the spring operating life, as well as the spring force, is to increase the overall barrel length. Doing so, however, results in a probe having an electrical interconnect of increased length resulting in the undesirable attenuation of the high frequency signals.

Typically, for a given application a given spring compliance is required. Probe spring compliance is defined by the distance of spring extension from its fully compressed position to its fully extended position in the probe. Consequently, with conventional probes the volume of the spring is limited by the required compliance. A longer spring incorporated in a conventional internal or external spring probe will reduce the plunger stroke length and thus, reduce the distance that the spring can extend from a fully compressed position. Thus, for a given probe, as the spring compliance increases, the spring volume decreases and so does the spring operating life.

An alternative type of conventional probe consists of two contact tips separated by a spring. Each contact tip is attached to a spring end. This type of probe relies on the walls of the test plate or socket cavity into which it is inserted for lateral support. The electrical path provided by this type of probe spirals down the spring wire between the two contact tips. Consequently, this probe has a relatively long electrical interconnect length which may result in attenuation of the high frequency signals when testing integrated circuits.

Thus, it is desirable to reduce the electrical interconnect length of a probe without reducing the spring volume. In addition, it is desirable to increase the spring volume without decreasing the spring compliance or increasing the electrical interconnect length. Moreover, it is desirable to provide a probe that can be easily and inexpensively manufactured and assembled.

Accordingly, it is an object of the subject invention to provide a new and improved test probe that is small enough to accommodate the increased density of leads on modern integrated circuit (IC) chips.

A further object of the subject invention is to provide a test probe that has durable and flexible contacts for connecting a component to a printed circuit board (PCB).

A further object of the subject invention is to provide a reliable test probe that will continue to operate as designed after numerous operational cycles.

Yet another objective of the subject invention is to provide a test probe that is capable of accepting leading edge IC packages such as ball grid array ("BGA"), chip scale packages ("CSP"), land grid array ("LGA"), quad fine pitch no lead ("QFN") packages and others.

A further object of the subject invention is to provide a new and improved test probe that is inexpensive to manufacture and has a minimum number of parts.

A further object of the subject invention is to provide a test probe that does not damage the pads of the printed circuit board onto which it is mounted.

Another object of the subject invention is to provide a test probe that is suitable for use in high frequency test applications.

A still further object of the subject invention is to provide a test probe, that is operative to establish a minimum resistance, minimum inductance electrical connection between the lead of an integrated circuit and a printed circuit board.

Additional objects and advantages of the invention will be set forth in the description that follows, and in part will be apparent from the description, or may be learned by practice of the invention. The objects and advantages of the invention may be realized and obtained by means of the instrumentalities and combinations pointed out in the appended claims.

SUMMARY

To achieve the foregoing objects, and in accordance with the purposes of the invention as embodied and broadly described in this document, there is provided an improved electrical spring probe for a connector assembly. The probe includes an elongated electrically conductive contact, having a beam and a head for contacting an integrated circuit package, and a spring. The spring is in the form of an elongated helical coil disposed about the beam and has a first and second opposing spring ends. The first spring end is attached to the contact near the head. The helical coil spring can be made of a suitably mechanically durable and conductive material with nickel and heavy gold plating.

According to one aspect of the invention, the elongated contact includes a shoulder intermediate the head and the beam, and the first spring end tightly holds the contact shoulder. Each of the first spring end and the second spring end includes a plurality of contiguous coils. The contiguous coils at the second spring end includes one or more coils with a smaller coil diameter than the coil diameter of a section of the spring intermediate the first and second ends of the spring. In one advantageous embodiment, the contact head includes a V-shaped slot for engaging a contact of the integrated circuit package. In another embodiment, the contact head has a rounded head for engaging a contact of the integrated circuit package.

According to another aspect of the invention, the first spring end engages the contact near the head and the first spring end and the beam are disposed generally along a main axis. The spring second end can include a spring terminus disposed toward the offset of the offset axis. The second spring end is disposed generally along an offset axis that is offset from the main axis. In this configuration, in operation, when the electrical spring probe is compressed against the integrated circuit package, the offset of the second spring end biases the contact beam into firm contact with the second spring end and establishes a direct electrical path between the contact head and the second end of the spring.

According to still another aspect of the invention, the elongated electrically conductive contact is a stamped contact. The stamped contact can have an offset foot formed at an end of the beam opposite the head and can have a shoulder intermediate the head and the beam for engaging the first spring end.

An electrical spring probe according to the invention can have shorter length than conventional probes without sacrificing the probe spring operational life and compliance. Moreover, the probe can be easily manufactured and assembled with inexpensive components. In addition, the probe is small enough to be used in the densities required by state of the art integrated circuit packages. Also, the probe has minimum electrical resistance and inductance.

BRIEF DESCRIPTION OF THE DRAWINGS

The accompanying drawings, which are incorporated in and constitute a part of the specification, illustrate the presently preferred embodiments of the invention and, together with the general description given above and the detailed description of the preferred methods and embodiments given below, serve to explain the principles of the invention.

FIG. 3 is an elevation view of the spring probe of FIG. 2 in partial cross-section, showing the spring probe held in a non-conductive substrate of a test assembly with the probe in an uncompressed position between a solder ball lead of an IC package and the pad of a printed circuit board.

FIG. 4 shows the operation of the spring probe of FIG. 3 as the spring probe is compressed. FIG. 4a shows the spring probe partially compressed by the IC package as the IC package lead presses against spring probe. FIG. 4b shows the spring probe fully compressed by the IC package and in test mode.

FIG. 5 depicts another embodiment of a spring probe according to the present invention, in which the probe has a stamped contact with a formed foot. FIG. 5a is a front elevation view of the embodiment, and FIG. 5b is a side elevation view of the embodiment showing the formed foot of the contact.

FIG. 6 depicts yet another embodiment of a spring probe according to the present invention, in which the probe has a stamped contact with a formed foot. FIG. 6a is a front elevation view of the embodiment, and FIG. 6b is a side elevation view of the embodiment showing the formed foot of the contact.

DESCRIPTION

Reference will now be made in more detail to presently preferred embodiments of the invention, as illustrated in the accompanying drawings. While I will describe the invention more fully with reference to these examples and drawings, the invention in its broader aspects is not limited to the specific details, representative devices, and illustrative examples shown and described. Rather, the description which follows is to be understood as a broad, teaching disclosure directed to persons of ordinary skill in the appropriate arts, and not as limiting upon our invention.

Figure 1:
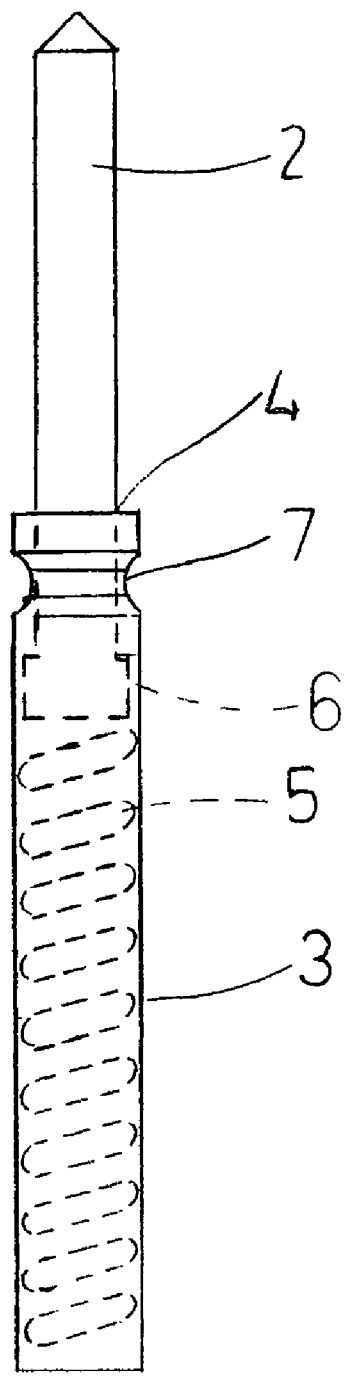
FIG. 1 is an elevation view of a traditional spring probe commonly found in the art.
Figure 2:
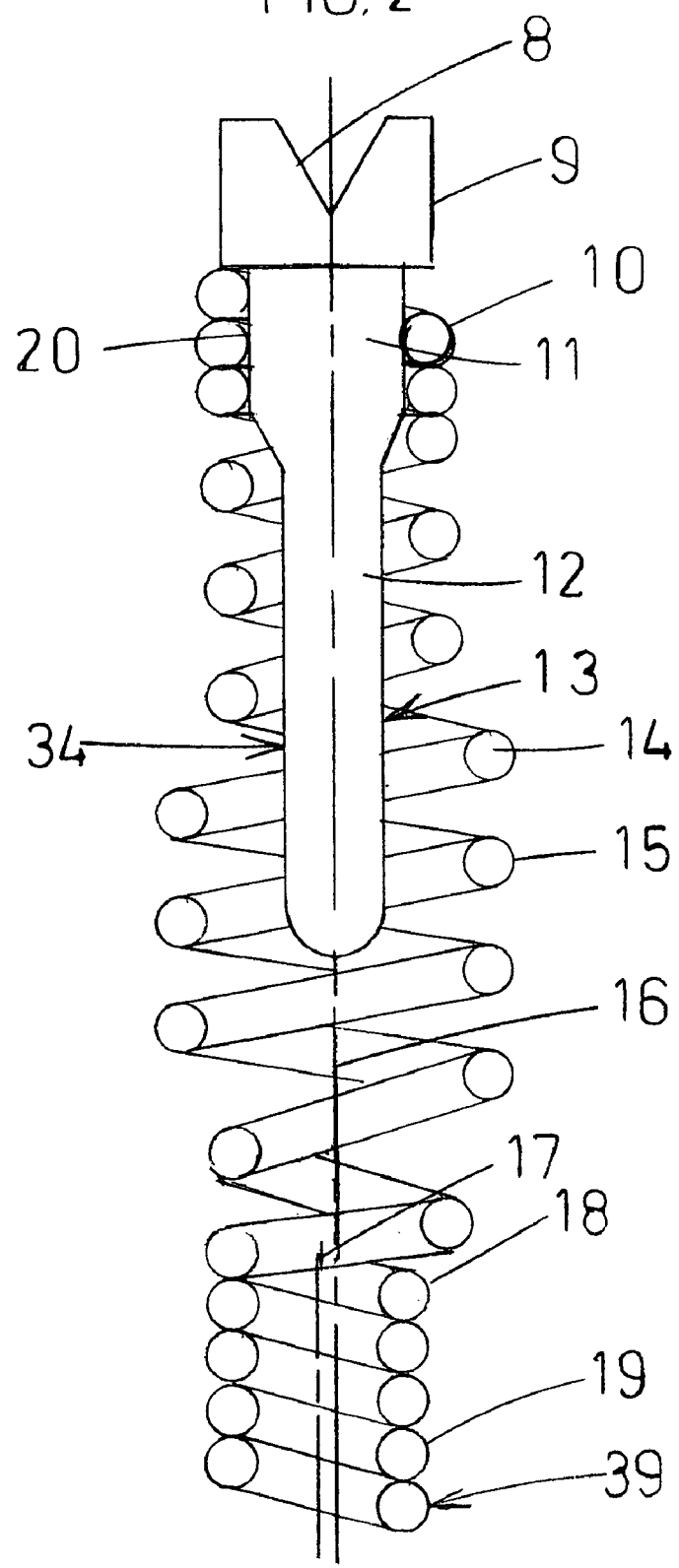
FIG. 2 is an elevation view, in partial cross-section, of one embodiment of an electrical spring probe according to the present invention, showing the helical coil spring disposed about the elongated contact with the contact in its initial rest position.

Referring to FIG. 2, an electrical spring probe assembly 34 according to the present invention is shown for connecting an IC package to a printed circuit board. The electrical spring probe 34 includes an elongated contact 13 and a helical compression spring 14. In one preferred embodiment, the contact 13 is in the form of a machined pin. The contact 13 includes a head 9 with a V-shaped slot 8 for contacting an IC package conductor, such as a solder ball lead. In this embodiment the, V-slot head is particularly suitable for contacting a BGA solder ball. It will be understood, however, that head 9 may have other configurations, such as a crown head or such as configurations suitable for contacting other types of leads. For example, the head may have a rounded tip for contacting leads on flat-leaded IC packages such as LGA, MLF, QFN, and strip packages, and the like. The contact also has a flexible beam 12 opposite the head 9 and a shoulder 11 intermediate the head 9 and the beam 12. The shoulder 11 has a diameter that is smaller than the diameter of the head 9 and larger than the diameter of the beam 12.

Still referring to FIG. 2, the compression spring 14 is disposed about the elongated contact 13. The compression spring 14 is generally cylindrically shaped and is formed from material having good spring characteristics, which permits resilient compression of the spring 14. Preferably, the compression spring 14 is formed from a single unitary conductor, which is coiled in a helical fashion. The spring 14 has an upper end 10, a larger diameter middle section 15, and a lower end 19. The spring upper end 10 is attached to the contact shoulder 11. The upper end 10 of the spring 14 has coils 20 that are contiguous. The coil diameter of the upper end 10 is slightly smaller than the diameter of the contact shoulder 11 to provide a tight fit between the upper end 10 and the shoulder 11. In this configuration, the spring 14 can be attached to the contact 13 by pressing the contact shoulder 11 into the spring upper end 10. The spring upper end 10, the beam 9 and the spring middle section 15 are disposed generally along a main axis 16. The spring middle section 15 is of open pitch configuration so that it can be longitudinally compressed under the action of opposing forces.

The spring lower end 19 is tightly wound such that a portion of the coils 18 are contiguous. The coils of the spring lower end 19 have a coil diameter that is less than that of the spring middle section 15. The internal coil diameter of the spring lower end 19 is greater than the diameter of the contact beam 12 to allow the beam 12 to enter into the spring lower end 19 when the spring probe 34 is compressed. The internal coil diameter of the spring lower end 19 is small enough, however, so that the beam 12 is deflected to bias the beam 12 into firm contact with the spring lower end 19 as the electrical spring probe is compressed, as described below.

The spring lower 19 end is disposed generally along an offset axis 17 that is offset from the main axis 16. The offset coils 18 are in line with adjacent, non-offset coils at an end of the spring middle section 15, which have a diameter greater than that of the offset coils 18 and less than that of the spring middle section 15, with the offset coils 18 being indented from one side of the adjacent non-offset coils. The spring lower end 19 is terminated at a terminus 39 on the same side of the spring as the indentation of the offset coils 18. In this configuration, in operation, when the electrical spring probe 34 is compressed, the offset of the spring lower end 19 helps deflect the contact beam and bias it into firm contact with the contiguous coils 18 of the spring lower end 19 and establishes a direct electrical path between the contact head 9 and the spring lower end 19.

Figure 3:
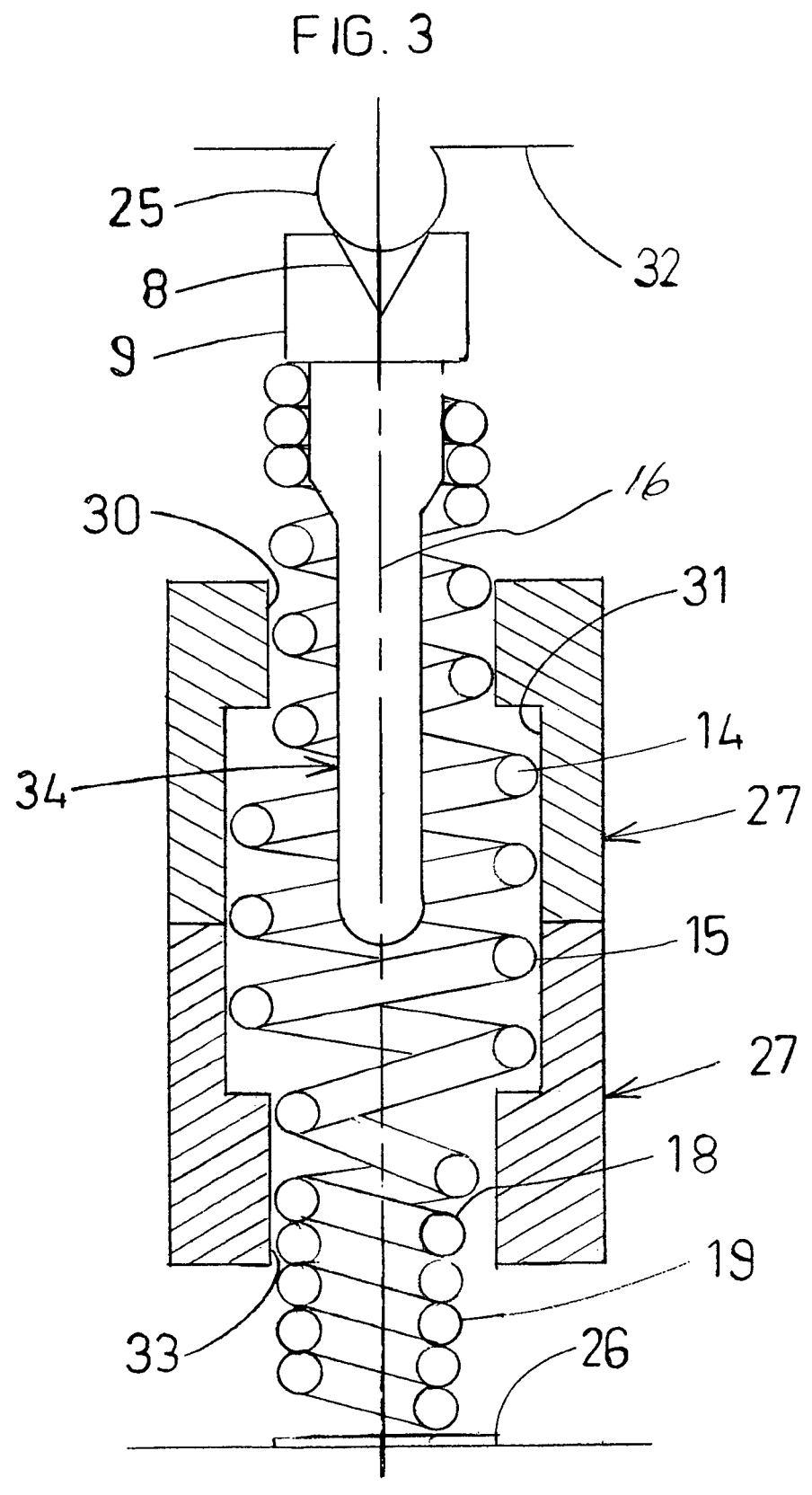

Referring to FIG. 3, the electrical spring probe 34 of FIG. 2 is shown positioned in a test assembly for forming a plurality of electrical connections between an IC package 32 and a printed circuit board. The printed circuit board has a plurality of conductive pads 26 that must be electrically connected to the IC package leads 25 to test the IC. In one embodiment of such a test assembly, a non-conductive substrate 27 has a plurality of annular through holes 31 extending between the top and bottom surfaces of the substrate 27. The through hole 31 has an upper opening 30 and a lower opening 33, each of which has a diameter that is smaller than an enlarged diameter portion of the through hole 31 intermediate the upper and lower openings 30, 33. In this configuration, each through hole 31 holds an electrical spring probe 34 in position over a PCB pad 26. In FIG. 3, the electrical probe 34 is shown in an uncompressed, initial rest position with an IC package lead 25 in contact with the contact head 9 of the spring probe assembly 34.

Still referring to FIG. 3, the contact head 9 is smaller diameter than that of the substrate upper opening 30. The outer diameter of the coils 20 of the spring upper end 10 also is slightly smaller than the reduced diameter section 30 of the through hole 31 to allow the spring upper end 10 to enter the substrate upper opening 30 when the spring probe is compressed. The diameter of the middle section 15 of the spring 14 is less than the inner diameter of the through hole 31 and is greater than the inner diameter of the upper opening 30 and lower opening 33 of the through hole 31, allowing the electrical probe assembly 34 to be retained within and to float in the substrate 27. The shoulder 11 is of a smaller diameter than the head 9 and of a slightly larger diameter than the inside diameter of the spring upper end 10, creating a tight fit 20 between the shoulder 11 and the spring upper end 10. The head 9 and some of the coils of the spring upper end 10 project above the top of the non-conductive substrate 27, while the beam 12 is partly disposed within the nonconductive substrate 27. The diameter of the beam 12 is smaller than the diameter of the substrate lower opening 33 and also is smaller than the inner coil diameter of the spring lower end 19. The contiguous coils 18 of the spring lower end 19 have an outer coil diameter that is less than the diameter of the restricted opening 33 in order to enable the bottom spring section 19 to extend beyond the bottom surface of the substrate 27 to make electrical contact with the printed circuit board pad 26.

The number of the spring probes 34 will generally correspond to the number of leads 25, e.g. solder ball leads, provided with the IC package 32. Also, the size of the substrate 27 is generally dependent on the size of the IC package 32. It should be noted that the substrate 27 need not be formed with the same dimensions as the IC package 32. However, the electrical spring probes 34 must be disposed in the substrate 27 such that the pressing contact is achieved between the probe head 9 and the leads 25 of the integrated circuit 32, with the spring probe assembly 34 being placed in face-to-face contact with the integrated circuit 32. The leads 25 may be disposed to define a plurality of rows and columns across the surface of the integrated circuit 32. Consequently, although not shown, it will be understood that the electrical spring probes 34 are to be aligned in a similar row-column pattern.

Referring to FIG. 3, during a testing operation, the printed circuit board pad 26 is brought into contact with the spring lower end 19 so as to make electrical contact and to partially compress the spring 14. Next, the integrated circuit package 32 is pressed against the contact head 9. Referring to FIG. 4a, the spring probe assembly 34 is shown being actuated downwardly within the substrate 27 by pressure from the integrated circuit 32 on the contact head 9 so as to cause an electrical connection between the spring 14 and the printed circuit board pad 26. As the integrated circuit is pressed into the connector assembly, the lead 25 engages the contact head 9, thereby resulting in downward movement of the contact 13. In this position, the spring middle section 15 is compressed to accommodate the retraction of the lower spring end 19 into the through hole 31.

As illustrated in FIG. 4b, as the spring 14 is further compressed, the terminus 39 of the spring lower end 19 deflects the spring coils 18 in the direction of the offset coil axis 17. As the contact 13 is moved downwardly into the through hole 31, the pressure on the spring terminus 39 also causes the offset coils 18 to flatten against the printed circuit board pad 26, thereby enhancing the biasing effect of the offset of the coils 18, and the contact beam 12 bears against the contiguous offset spring coils 18. The contact beam 12 makes electrical contact with the coils 18 of the spring lower end 19, thereby providing a direct electrical path from the lead 25, through the length of the contact 13, through the contiguous coils 18 and to the printed circuit board pad 26. In effect, the contiguous coils 18 of the spring lower end 19 are equivalent to a solid cylindrical contact. As a result, the electrical path between the integrated circuit lead 25 and the printed circuit board pad 26 is a direct, almost straightforward path, which minimizes resistance and inductance, and enables the contact to operate at higher frequencies.

Referring to FIGS. 5a and 5b, an alternate embodiment of a spring probe according to the invention includes a stamped elongated contact 23 and a helical spring 24. The stamped contact 23 includes a head 9, with a rounded tip 22 for contacting a flat lead 38 of an integrated circuit package 38. The rounded tip 22 is particularly suitable for making contact with flat leaded IC packages such as LGA, MLF, QFN, and the like. It will be understood, however, that head 9 may have other configurations suitable for contacting other types of leads, such a V-Slot head to enable contact with integrated circuits having solder ball leads. The stamped contact 23 also includes a shoulder 11 intermediate the head 9 and a beam 12 including a formed foot 24. The helical spring 14 includes an upper end 10 and lower end 19, each having contiguous coil sections, and an expanded diameter middle section 15. The shoulder 11 is of a width less than that of the head 9 and of a slightly larger width than the inside diameter of spring upper end 10, thereby allowing for a tight fit 20 between the shoulder 11 and the spring upper end 10 to attach the contact 23 to the spring 14. In operation, as the spring probe assembly is positioned on a printed circuit board 26 and the IC package 38 is engaged against the rounded tip 22 on the contact head 9, the formed foot 24 slides into contact with the bottom contiguous coils 19. This provides a direct electrical path from the IC lead 38, through the stamped contact 23 to the continuous coils 19 of the spring lower end 18 and to the printed circuit board pad 26.

Referring to FIGS. 6a and 6b, another alternate embodiment of a spring probe according to the invention includes a stamped elongated contact 23 and a helical spring 24. The stamped contact 23 includes a head 9, with a rounded tip 22 for contacting a flat lead 38 of an integrated circuit package 38. It will be understood, however, that head may have other configurations suitable for contacting other types of leads, such a V-Slot head to enable contact with integrated circuits having solder ball leads. The stamped contact 23 also includes a wide shoulder 11 intermediate the head 9 and a beam 12 with a formed foot 24. The helical spring 14 includes an expanded coil section 15 and a lower end 19 having contiguous coils. The shoulder 11 is wider than the head 9 and approximately the same width as the outside diameter of the expanded coil section 15. The top the spring rests against the bottom of the shoulder 11. The top of the contact beam 12 includes an expanded section that centers the spring 14 on the contact. The shoulder 11 and spring expanded coil section 15 are contained within expanded center section 31 of the non-conductive substrate 27. The head 9 of the stamped, elongated, contact 23 projects above the top of the non-conductive substrate 27. The bottom contiguous coils 19 of the spring 14 project below the bottom of the non-conductive substrate 27. In operation, as the spring probe assembly of FIG. 6 is positioned on a printed circuit board 26 and the IC package 38 is engaged with the rounded tip 22 on the contact head 9, the formed contact beam 24 slides into contact with the bottom contiguous coils 19 and thereby provides a direct electrical path from the IC lead 38, through the stamped contact 23, to the spring bottom contiguous coils 19 and to the printed circuit board pad 26.

From the foregoing, it can be seen that the spring probe assembly of the present invention possesses numerous advantages. It can have shorter length than conventional probes without sacrificing the probe spring operational life and compliance. Moreover, it can be easily manufactured and assembled with inexpensive components. In addition, the probe is small enough to be used in the densities required by state of the art integrated circuit packages. It is suited to be used in contact assemblies at a high density so that a plurality of points concentrated in a small area may be accessed at the same time. It can be employed in various configurations for electrically accessing a variety of lead configurations on leading edge, area array, surface mount integrated circuit packages (BGA, LGA, MLF, WLP), either singulated or in multi package strips or as wafer level packages. Also, the probe has minimum electrical resistance and inductance.

Additional advantages and modifications may readily occur to those skilled in the art. Therefore, the invention in its broader aspects is not limited to the specific details, representative devices, and illustrative examples shown and described. Accordingly, departures may be made from such details without departing from the spirit or scope of the general inventive concept.

What is claimed is:

1. An electrical spring probe for a connector assembly comprising:

an elongated electrically conductive contact having a head for contacting a conductive surface and a beam having an end opposite the head; and a spring comprising an elongated helical coil disposed about the beam and having a first and a second opposing spring ends, wherein the first spring end is attached to the contact near the head;

wherein the second spring end makes contact with the beam end when the spring is compressed; and wherein the first spring end and the beam are disposed generally along a main axis and the second spring end is disposed generally along an offset axis that is offset from the main axis.

2. The electrical spring probe of claim 1 wherein the contact includes a shoulder intermediate the head and the beam and the first spring end tightly holds the contact shoulder.

3. The electrical spring probe of claim 1 wherein the first spring end includes a plurality of contiguous coils.

4. The electrical spring probe of claim 1 wherein the second spring end includes a plurality of contiguous coils.

5. The electrical spring probe of claim 1 wherein the first and second ends of the spring include contiguous coils and wherein the contiguous coils at the second end include one or more coils with a smaller coil diameter than the coil diameter of a section of the spring intermediate the first and second ends of the spring.

6. The electrical spring probe of claim 1 wherein the second end of the spring includes one or more coils with a smaller coil diameter than the coil diameter of a section of the spring intermediate the first and second ends of the spring.

7. The electrical spring probe of claim 1 wherein the helical coil spring is made of a suitably mechanically durable and conductive material with nickel and heavy gold plating.

8. The electrical spring probe of claim 1 wherein the contact head includes a V-shaped slot for engaging a contact of an integrated circuit package.

9. The electrical spring probe of claim 1 wherein the contact head has a rounded shape for engaging a contact of an integrated circuit package.

10. The electrical spring probe of claim 1 wherein the elongated electrically conductive contact has a generally flattened shape.

11. The electrical spring probe of claim 1 wherein the contact includes an offset foot formed at the beam end.

12. The electrical spring probe of claim 1 wherein the contact includes a shoulder intermediate the head and the beam and the first spring end tightly holds the contact shoulder.

13. An electrical spring probe for a connector assembly comprising:

an elongated electrically conductive contact having a beam and a head for contacting a conductive surface; and an elongated helical coil spring disposed about the beam and having a first and a second opposing spring ends, wherein the first spring end engages the contact near the head and the first spring end and the beam are disposed generally along a main axis; and wherein the second spring end is disposed generally along an offset axis that is offset from the main axis;

whereby, in operation, when the electrical spring probe is compressed against the conductive surface, the offset of the second spring end biases the contact beam into firm contact with the second spring end and establishes a direct electrical path between the contact head and the second end of the spring.

14. The electrical spring probe of claim 13 wherein the second spring end includes a plurality of contiguous coils.

15. The electrical spring probe of claim 13 wherein the spring second end includes a spring terminus disposed toward the offset of the offset axis.

16. The electrical spring probe of claim 13 wherein the second end of the spring includes one or more coils with a smaller coil diameter than the coil diameter of a section of the spring intermediate the first and second ends of the spring.

17. The electrical spring probe of claim 13 wherein the first and second ends of the spring include contiguous coils and wherein the contiguous coils at the second end include one or more coils with a smaller coil diameter than the coil diameter of a section of the spring intermediate the first and second ends of the spring.

18. The electrical spring probe of claim 13 wherein the first spring end is attached to the contact near the head.

19. The electrical spring probe of claim 18 wherein the contact includes a shoulder intermediate the head and the beam and the first spring end tightly holds the contact shoulder.

20. The electrical spring probe of claim 13 wherein the first spring end includes a plurality of contiguous coils.

21. The electrical spring probe of claim 13 wherein the contact head includes a V-shaped slot for engaging a contact of an integrated circuit package.

22. The electrical spring probe of claim 13 wherein the contact head has a rounded head for engaging a contact of an integrated circuit package.

23. The electrical spring probe of claim 13 wherein the helical coil spring is made of a suitably mechanically durable and conductive material with nickel and heavy gold plating.

24. An electrical spring probe for a connector assembly comprising:

an elongated electrically conductive contact having a beam, a head for contacting a conductive surface and a shoulder intermediate the head and the beam; and a spring comprising an elongated helical coil disposed about the beam and having first and second opposing spring ends, wherein the first spring end and the beam are disposed generally along a main axis and wherein the first spring end includes a plurality of contiguous coils and the second spring end includes a plurality of contiguous coils; and wherein the first spring end tightly holds the contact shoulder and one or more of the second spring end contiguous coils have a smaller coil diameter than the coil diameter of a section of the spring intermediate the first and second ends of the spring; and wherein the second spring end is disposed generally along an offset axis that is offset from the main axis;

whereby, in operation, when the electrical spring probe is compressed against the conductive surface, the offset of the second spring end biases the contact beam into firm contact the second spring end and establishes a direct electrical path between the contact head and the second end of the spring.

25. The electrical spring probe of claim 24 wherein the spring second end includes a spring terminus disposed toward the offset of the offset axis.

26. The electrical spring probe of claim 13 wherein the main axis and the offset axis are substantially parallel.

* * * * *